United States Patent [19]

Kakihana

[11] Patent Number: 4,826,070
[45] Date of Patent: May 2, 1989

[54] DIE ATTACHMENT PROCESS

[75] Inventor: Sanehiko Kakihana, San Francisco, Calif.

[73] Assignee: Menlo Industries, Inc., Fremont, Calif.

[21] Appl. No.: 104,882

[22] Filed: Oct. 5, 1987

[51] Int. Cl.$^4$ .............................................. B23K 31/00
[52] U.S. Cl. .................................................... 228/123
[58] Field of Search ............... 228/123, 124, 221, 236, 228/263.18

[56] References Cited

U.S. PATENT DOCUMENTS

| | | | |
|---|---|---|---|
| 3,914,836 | 10/1975 | Hafner et al. | 228/221 |
| 4,407,658 | 10/1983 | Bernot et al. | 228/221 |
| 4,418,857 | 12/1983 | Ainslie et al. | 228/124 |
| 4,465,223 | 8/1984 | Cammarano et al. | 228/123 |
| 4,476,151 | 10/1984 | Keller et al. | 228/221 |
| 4,540,115 | 9/1985 | Hawrylo | 228/123 |

Primary Examiner—M. Jordan
Attorney, Agent, or Firm—Skjerven, Morrill, MacPherson, Franklin & Friel

[57] ABSTRACT

Disclosed is a process for attaching a die to a package, which process utilizes a heat cycle in conjunction with a vacuum in the attachment process.

7 Claims, 1 Drawing Sheet

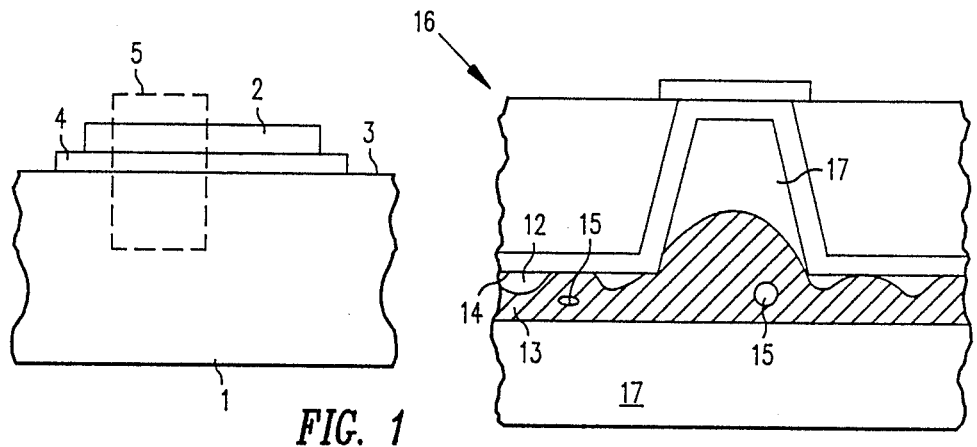
FIG. 1
FIG. 4
(Prior Art)
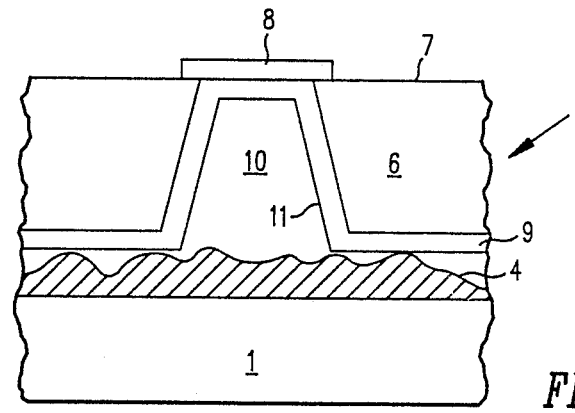
FIG. 2
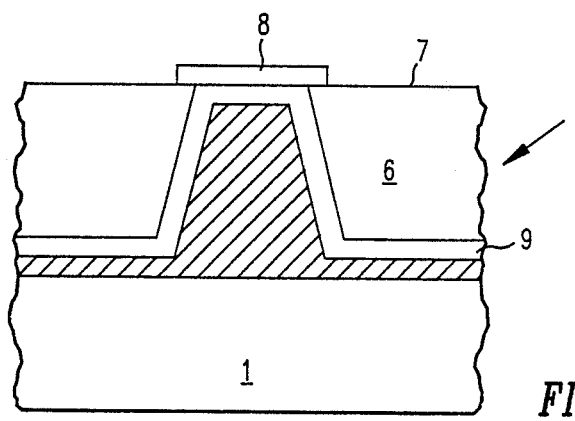
FIG. 3

DIE ATTACHMENT PROCESS

BACKGROUND OF THE INVENTION

1. Field of the Invention

This invention relates to the field of packaging semiconductor devices, and more particularly to attaching a die to a package.

2. Description of the Prior Art

In packaging of integrated circuit devices, as well as discrete semiconductor devices, one of the major problems involved is providing good thermal bonding between the die and the package to which the die is attached. A commonly used method of attaching a die to a package is to coat the surface of the package to which the die is to be attached with a metallic composition, commonly referred to as a preform, which, when heated, melts and causes the die to adhere to the package. FIG. 4 illustrates a section taken through a portion of a GaAs device packaged by the foregoing process. As will be appreciated by reference to FIG. 4, a major problem in this type of die attachment process is that voids 12 are formed, that is incomplete bonding occurs between preform 13 and the adjacent side of the die 14 occurs, for example, by the inclusion of air. Also, gases may be trapped in the preform, resulting in voids 15 within the preform 13. Such incomplete bonding prevents good heat flow from die 16 to package 17 and causes what is referred to as "hot spots". More particularly, good heat transfer does not occur where the air is trapped between the preform material and the adjacent surface of the die and in particular in connection with high power devices catastrophic failure may occur. Such problem is especially acute for power GaAs microwave monolithic integrated circuits where it is not uncommon to have two watts of DC power dissipated for one watt of output power from such device. One of the common causes for voids is the out-gasing of the preform alloy during the die attachment and the subsequent trapping of air bubbles.

The task of successfully attaching a GaAs microwave monolithic integrated circuit to a package is further complicated because that type of device includes a backside via hole 17 which is opened to the field effect transistor source on the front side of die 16. This hole is generally plated, but not planarized, and accordingly can easily trap air during the die attachment, forming not only a void at the via, but also affecting the quality of the die attachment in the vicinity of the via hole area.

Prior art attempts to minimize voids in the attachment of a die to a package have included choosing the preform material such that it has the characteristics of minimum out-gasing and tightly controlling the attachment process from a temperature standpoint.

SUMMARY OF THE INVENTION

It is an object of the present invention to provide a die attachment process which provides the void-free attachment of a die to a package. A further object of the present invention is to provide a void-free attachment with a process having wide margins for the parameters to thereby reduce the cost of die attachment.

In accordance with a feature of the invention, a process for attaching a die of semiconductor material to a surface of a package is provided which comprises the steps of: applying a meltable material to the surface of said package to which said die is to be attached; positioning said die on said material; subjecting said die and package to a vacuum; heating the die and package to a first temperature which is below the melting point of said material; heating said die and package to a second temperature which is sufficient to melt said material and permit said material to flow and make substantially full contact with the adjoining surface of said die; and lowering the temperature of said die and package below the melting point of said material.

Another feature of the present invention provides a process in which the foregoing meltable material comprises a metallic solder composition comprising 80% gold and 20% tin.

In accordance with another feature of the invention, the die and package of the above mentioned process are subjected to a vacuum in the range of $10^{-3}$ Torr to $10^{-4}$ Torr.

In accordance with another feature of the invention, the above mentioned process is practiced wherein the first temperature is in the range of 100 degrees centigrade to 150 degrees centigrade and the second temperature is in the range of 250 degrees centigrade to 300 degrees centigrade.

As yet another feature of the invention, the foregoing process is practiced wherein the die and package are maintained at the second temperature for at least three minutes.

In accordance with a further feature of the invention, the foregoing processes are practiced and include a further step of cooling the die and package following said flow at the second temperature level at a cooling rate of not greater than about thirty degrees centigrade per minute.

BRIEF DESCRIPTION OF THE DRAWINGS

Other objects and advantages of the invention will become apparent from a study of the specification and drawings in which:

FIG. 1 illustrates in side view a package with preform and die, greatly enlarged;

FIG. 2 illustrates in cross section a portion of FIG. 1, highly magnified, prior to completion of die attachment;

FIG. 3 illustrates a completed die attachment showing in cross section the resulting structure; and FIG. 4 illustrates the incomplete bonding which results from prior art processes.

DETAILED DESCRIPTION OF THE INVENTION

Referring to FIG. 1, illustrated is package 1 on which it is desired to attach die 2 which is placed on surface 3 and rests upon preform material 4. With respect to the package, die and preform material illustrated in FIG. 1, the prior art method of attaching a die to a package utilizes a preform material as the meltable interface between the die and surface of the package. However, as pointed out in the above description of the prior art, heretofore attempted solutions have not been totally satisfactory and the present invention overcomes those prior problems. To illustrate the invention, a portion of a device included in die 2, as well as preform 4 and package 1 will be shown in greatly magnified form and such view is illustrated in FIG. 2. Dashed line 5 in FIG. 1 indicates the general location of the section illustrated in FIG. 2.

Referring to FIG. 2, since one of the most difficult types of devices to attach to a package is a GaAs microwave monolithic integrated circuit which includes a through substrate via hole, the section illustrated at 5 (in FIG. 1) is shown in FIG. 2 to illustrate this difficult attachment area. FIG. 2 illustrates, in greatly exaggerated scale, a section of a GaAs microwave monolithic integrated circuit having a substrate 6, including an upper surface 7 which includes, but which is not shown in this Figure, active devices for the integrated circuit. Illustrated in FIG. 2, however, is source metallization 8 which is connected to the source of a field effect transistor included on the die. As is conventional with GaAs microwave monolithic integrated circuit devices, source metallization 8 is connected to backplane metallization 9 by means of a via hole 10 through substrate 6. As will be appreciated by reference to FIG. 2, via hole 10 is a source of trapped air and gases, and in prior art packaging techniques led to a less than complete seal between preform material 4 and the outer surface of backplane metallization 9, this outer surface being indicated by reference character 11. As will be noted by reference to FIG. 2, the top surface of preform material is rough and does not make a smooth contact with outer surface 11 of backplane metallization 9.

Attaching die 2 to package 1 in accordance with the present invention begins by placing die 2 on preform material 4. It has been found to be preferable to utilize preform material 4 consisting of a composition comprising 80% gold and 20% tin. After positioning die 2 in the appropriate location on package 1, the combination is placed in a vacuum oven and a vacuum is applied with a range of $10^{-3}$ Torr to $10^{-6}$ Torr. Once the vacuum has been reached, a heating is performed to raise the oven temperature to approximately 150° C., which is below the melting temperature of preform 4. Raising the temperature of preform material 4 to 150° C. causes preform material 4 to release the gas which would otherwise be trapped and this gas is evacuated by the vacuum being applied. It has been found desirable to retain the temperature at approximately 150° C. for approximately 15 minutes to permit the complete evacuation of gases. Following the out-gas evacuation, the temperature in the oven is raised to approximately 280° C. and maintained at that temperature for three to five minutes. This temperature is adequate to cause preform material 4 to melt and form good contact with surface 11 of backplane metallization 9 and to also, by capillary attraction, fill via hole 10 and establish a complete contact to outer surface 11 of backplane metallization 9, this completed reflow being illustrated in FIG. 3.

To avoid deformation of die 2 and the possible creation of cracks in preform material 4, it is important to cool the completed reflowed die package combination slowly. For preform metallization of the composition indicated above, it has been found that the preferable rate of cooling is in the range of not greater than twenty to thirty degrees centigrade per minute, this cooling being continued until room temperature is reached. After room temperature is reached, the attached die and package are removed from the vacuum oven and the process is then completed.

It will of course be appreciated that the process parameters indicated above are ones which have been found preferable for use with preform material 4 having the composition so indicated and for connection of a die utilizing backplane metallization 9 consisting of gold. Other materials utilized for the preform, and/or backplane metallization 9 will of course likely require deviation from the temperatures utilized as well as the time duration for each of the steps. Also, the nature of preform material 4 may require different levels of vacuum to insure that the out-gasing step completely clears the unwanted gases from the structure.

To those skilled in the art, certain deviations will be apparent which may be employed without departing from the spirit and scope of the invention. It is if course understood that the scope of the invention is not determined by the foregoing description, but only by the following claims.

I claim:

1. A process for attaching a die of semiconductor material to a surface of a package, comprising the steps of:
    applying a meltable material to the surface of said package to which said die is to be attached;
    positioning said die on said material;
    subjecting said die and package to a vacuum;
    heating the die and package to a first temperature which is below the melting point of said material;
    heating said die and package to a second temperature which is sufficient to melt said material and permit said material to flow and make substantially full contact with the adjoining surface of said die; and
    lowering the temperature of said die and package below the melting point of said material.

2. The process of claim 1, wherein said meltable material comprises a metallic solder composition comprising:
    80% gold;
    20% tin.

3. The process of claims 1 or 2, wherein said die and package are subjected to a vacuum in the range of $10^{-3}$ Torr to $10^{-4}$ Torr.

4. The process of claim 2, wherein said die and package are subjected to a vacuum in the range of $10^{-3}$ Torr to $10^{-4}$ Torr, said first temperature is in the range of 150 degrees centigrade to 100 degrees centigrade, and said second temperature is in the range of 250 degrees centigrade to 300 degrees centigrade.

5. The process of claim 4, wherein said die and package are maintained at said second temperature for at least three minutes.

6. The process of any of claims 1–2 or 4–5, further comprising the step of cooling said die and package following said flow at said second temperature level at a cooling rate of not greater than about thirty degrees centigrade per minute.

7. The process of claim 5, further comprising the steps of cooling said die and package following said flow at said second temperature level at a cooling rate of not greater than about thirty degrees centigrade per minute until said die and package have reached ambient temperature and thereafter removing said die and package from said vacuum.

* * * * *